(12) United States Patent
Lee

(10) Patent No.: US 10,163,383 B2
(45) Date of Patent: Dec. 25, 2018

(54) DISPLAY DEVICE INCLUDING GATE IN PANEL CIRCUIT PROVIDED ON DISPLAY AREA

(71) Applicant: LG Display Co., Ltd., Seoul (KR)

(72) Inventor: JungHyun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/383,957

(22) Filed: Dec. 19, 2016

(65) Prior Publication Data

US 2017/0193893 A1  Jul. 6, 2017

(30) Foreign Application Priority Data

Dec. 31, 2015  (KR) ........................ 10-2015-0191218

(51) Int. Cl.
| G09G 3/20 | (2006.01) |
| G02F 1/1345 | (2006.01) |
| G09G 3/3266 | (2016.01) |
| G09G 3/36 | (2006.01) |

(52) U.S. Cl.
CPC ....... G09G 3/2092 (2013.01); G02F 1/13454 (2013.01); G09G 3/3266 (2013.01); G09G 3/3674 (2013.01); G09G 2300/0408 (2013.01); G09G 2300/0426 (2013.01); G09G 2300/08 (2013.01); G09G 2310/0267 (2013.01); G09G 2310/0281 (2013.01); G09G 2310/08 (2013.01)

(58) Field of Classification Search
CPC ..................... G09G 3/2092; G09G 2300/0408
See application file for complete search history.

(56) References Cited

U.S. PATENT DOCUMENTS

| 9,704,429 | B2* | 7/2017 | Seo ....................... G09G 3/2085 |
| 9,985,055 | B2* | 5/2018 | Makita ................ H01L 27/1277 |
| 2002/0182828 | A1* | 12/2002 | Asami ................. C23C 16/0272 |
| | | | 438/485 |
| 2008/0100766 | A1* | 5/2008 | Ming ................ G02F 1/136227 |
| | | | 349/44 |
| 2010/0176395 | A1 | 7/2010 | Choi et al. |
| 2011/0108846 | A1 | 5/2011 | Choi et al. |
| 2014/0028534 | A1 | 1/2014 | Park et al. |
| 2014/0043306 | A1 | 2/2014 | Min et al. |
| 2014/0056399 | A1 | 2/2014 | Shang |
| 2015/0145852 | A1 | 5/2015 | Ahn et al. |
| 2015/0185520 | A1 | 7/2015 | Xu |
| 2015/0279258 | A1 | 10/2015 | Shin |

(Continued)

FOREIGN PATENT DOCUMENTS

| CN | 104680989 A | 6/2015 |
| CN | 104849928 A | 8/2015 |

(Continued)

OTHER PUBLICATIONS

Office action dated Nov. 14, 2017 in the corresponding Japanese patent application JP 2016-242903.

(Continued)

Primary Examiner — Gene W Lee
(74) Attorney, Agent, or Firm — Polsinelli PC

(57) ABSTRACT

Disclosed is a display device that may include a GIP circuit, provided on a display area of a substrate, for supplying gate signals to gate lines, wherein the GIP circuit includes a thin film transistor provided in the boundaries between adjacent pixels.

16 Claims, 7 Drawing Sheets

(56) References Cited

U.S. PATENT DOCUMENTS

| | | |
|---|---|---|
| 2015/0310821 A1 | 10/2015 | Kim et al. |
| 2016/0267831 A1* | 9/2016 | Seo ..................... G09G 3/2085 |
| 2016/0307517 A1 | 10/2016 | Park et al. |
| 2016/0307937 A1 | 10/2016 | Jin |
| 2017/0025070 A1* | 1/2017 | Kang ................. H01L 27/3276 |
| 2017/0047038 A1 | 2/2017 | Noma et al. |
| 2017/0193939 A1 | 7/2017 | Lee et al. |
| 2017/0255074 A1 | 9/2017 | Nishiyama et al. |

FOREIGN PATENT DOCUMENTS

| | | |
|---|---|---|
| CN | 104851918 A | 8/2015 |
| EP | 2 690 490 A2 | 1/2014 |
| JP | WO2016/080542 A1 | 8/2017 |
| KR | 20130135043 A | 12/2013 |
| TW | 201543461 A | 11/2015 |

OTHER PUBLICATIONS

Office Action dated Jul. 3, 2018 issued in a corresponding Japanese patent application No. 2016-242903.
Office Action with English translation dated Oct. 23, 2018 issued in the corresponding Chinese Patent Application No. 201611138997.2, pp. 1-20.

\* cited by examiner

DISPLAY DEVICE INCLUDING GATE IN PANEL CIRCUIT PROVIDED ON DISPLAY AREA

CROSS REFERENCE TO RELATED APPLICATIONS

This application claims the benefit of the Korean Patent Application No. 10-2015-0191218 filed in the Republic of Korea on Dec. 31, 2015, which is hereby incorporated by reference in its entirety as if fully set forth herein.

BACKGROUND

Field of the Disclosure

The present disclosure relates to a display device, and more particularly, to a display device with a gate in panel (GIP) structure, that is, a display device with a gate driver provided in a panel. Although the present disclosure is suitable for a wide scope of applications, it is particularly suitable for implementing a display device having a narrow bezel width without sacrificing an aperture ratio.

Discussion of the Background

A display device such as a liquid crystal display device and an organic light emitting display device includes a display area for displaying an image, and a non-display area formed in the periphery of the display area. Herein, a plurality of pixels is provided in the display area for displaying an image, and a driver for driving the plurality of pixels is provided in the non-display area.

The driver includes a gate driver for applying a gate signal to a gate line in the display area, and a data driver for applying a data signal to a data line in the display area.

The gate driver includes a gate integrated circuit for applying the gate signal to each of the plurality of gate lines, and the data driver includes a data integrated circuit for applying the data signal to each of the plurality of data lines.

Generally, the gate integrated circuit and the data integrated circuit are manufactured in a type of chip, and are mounted on a film (i.e., chip on film) or mounted on a substrate (i.e., chip on glass). However, if the gate integrated circuit and the data integrated circuit are manufactured in a type of chip, it causes the increase in manufacturing cost due to the increase in the number of elements. Also, it has limitation on lightness in weight of display device. Thus, it has been proposed a gate in panel (GIP) structure in which the gate integrated circuit is directly formed on the substrate without manufacturing the gate integrated circuit as a type of chip.

Hereinafter, a related art display device with a GIP structure will be described with reference to the accompanying drawings.

FIG. 1 is a plane view illustrating a related art display device.

As shown in FIG. 1, the related art display device includes a display area (D/A) and a non-display area (ND/A) on a substrate 1.

Although not shown in detail, a plurality of pixels are disposed in the display area (D/A), wherein the pixels are defined by crossing gate and data lines, and a thin film transistor and a pixel electrode are located in each pixel.

In the non-display area (ND/A), there is a GIP circuit (GIP) for applying a gate signal to the gate line. The GIP circuit (GIP) includes a plurality of thin film transistors.

In the non-display area (ND/A), there are a data link line (DLL), a data pad (DP), and a data driver (DD), so as to apply a data signal to the data line. The data link line (DLL) connects the data line and the data pad (DP) with each other, and the data driver (DD) is connected with the data pad (DP).

In the related art display device, the GIP circuit (CIP) is provided at one side of the display area (D/A), for example, a left peripheral region, and the data link line (DLL), the data pad (DP), and the data driver (DD) are provided at the other side of the display area (D/A), for example, an upper peripheral region, whereby it has limitations on decrease in the non-display area (ND/A).

In order to satisfy a user's demand for various designs, a method for decreasing a bezel width corresponding to the non-display area (ND/A) of the display device has been studied recently. However, in the related art display device with the GIP structure, it has limitations on decrease in the non-display area (ND/A), whereby it is difficult to realize a narrow bezel width.

SUMMARY

Accordingly, the present disclosure is directed to a display device that substantially obviates one or more problems due to limitations and disadvantages of the related art.

An aspect of the present disclosure is to provide a display device which is capable of realizing a GIP structure and also realizing a narrow bezel width.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of aspects of the present disclosure, as embodied and broadly described herein, there is provided a display device that may include a GIP circuit, provided on a display area of a substrate, for supplying gate signals to gate lines, wherein the GIP circuit includes a thin film transistor provided in the boundaries between adjacent pixels.

In another aspect of the present disclosure, a display device having a gate in panel structure comprises first and second gate lines on a display area and disposed to a first direction; first and second data lines on the display area and disposed to a second direction and the first and second gate lines and the first and second data lines crossing with each other; first and second pixels defined by the first and second gate lines and first and second data lines; a gate in panel (GIP) circuit supplying a gate signal to the first and second gate lines, the GIP circuit including a first thin film transistor disposed between the first and second pixels.

It is to be understood that both the foregoing general description and the following detailed description of the present disclosure are exemplary and explanatory and are intended to provide further explanation of embodiments of the disclosure as claimed.

BRIEF DESCRIPTION OF THE DRAWINGS

The accompanying drawings, which are included to provide a further understanding of aspects of the disclosure and are incorporated in and constitute a part of this application, illustrate aspect(s) of the disclosure and together with the description serve to explain the principle of embodiments of the disclosure. In the drawings.

DETAILED DESCRIPTION DISCLOSURE

Figure 1:
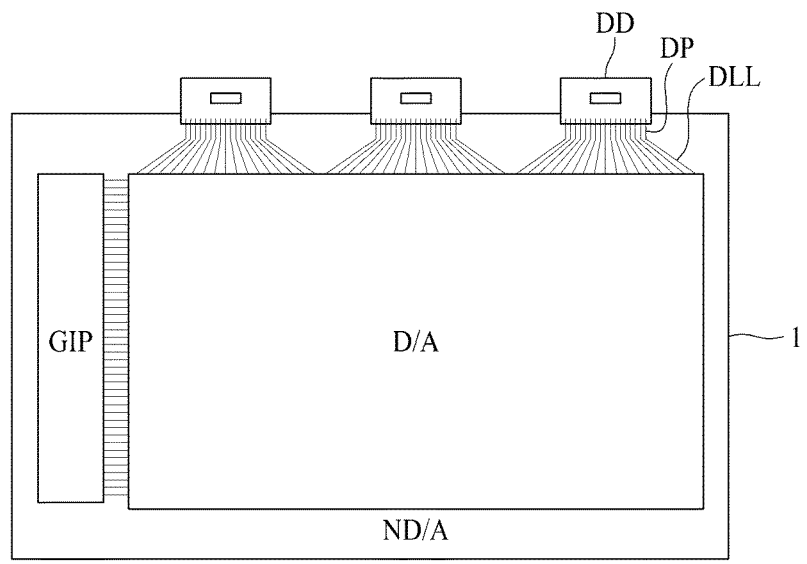
FIG. 1 is a plane view illustrating a related art display device.

Reference will now be made in detail to the exemplary embodiments of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In description of aspects of the present disclosure, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, a display device according to aspects of the present disclosure will be described in detail with reference to the accompanying drawings.

Figure 2:
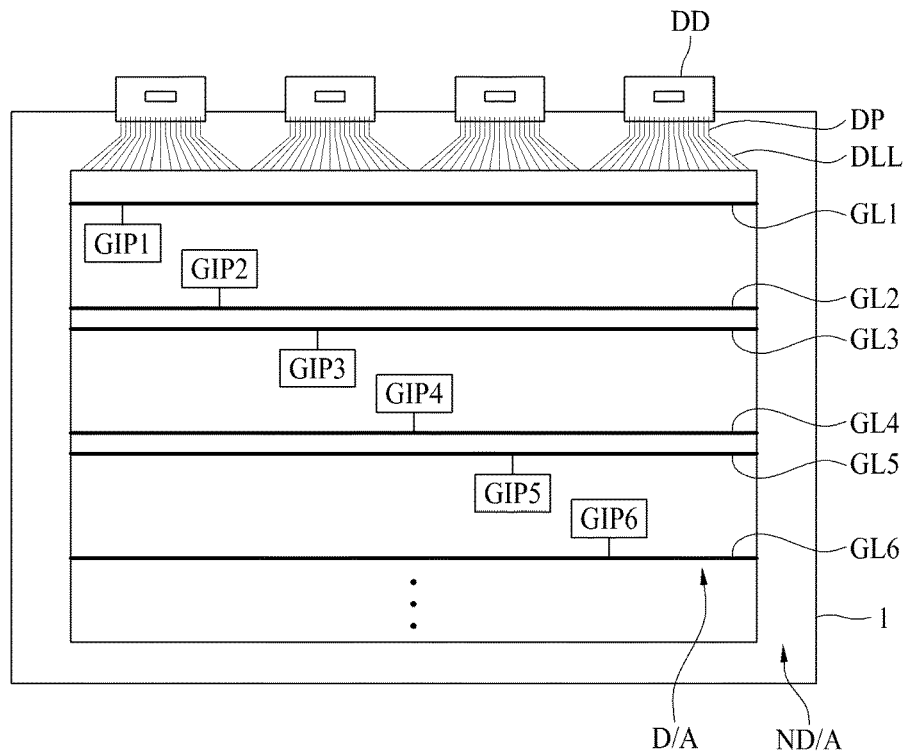
FIG. 2 is a plane view illustrating a display device according to one aspect of the present disclosure.

FIG. 2 is a plane view illustrating a display device according to one aspect of the present disclosure.

As shown in FIG. 2, the display device according to one aspect of the present disclosure may include a display area (D/A) and a non-display area (ND/A) on a substrate 1.

In the display area (D/A), there are a plurality of gate lines (GL1~GL6) arranged in a first direction, for example, a latitudinal direction of the substrate 1, and a plurality of data lines (not shown) arranged in a second direction, for example, a longitudinal direction of the substrate 1. A plurality of pixel regions are defined by crossing the plurality of gate lines (GL1~GL6) and the plurality of data lines (not shown). For convenience of explanation, FIG. 2 shows only six gate lines (GL1~GL6).

In the display area (D/A), there are a plurality of GIP circuits (GIP1~GIP6). The first GIP circuit (GIP1) supplies a gate signal to the first gate line (GL1), and each of the second to sixth GIP circuits (GIP2~GIP6) supplies a gate signal to each of the second to sixth gate lines (GL2~GL6).

According to one aspect of the present disclosure, the plurality of GIP circuits (GIP1~GIP6) are provided in the display area (D/A) so that it is possible to decrease a size of the non-display area (ND/A), and to decrease a bezel width of the display device.

According to one aspect of the present disclosure, since the plurality of GIP circuits (GIP1~GIP6) are provided in the display area (D/A), an area for the plurality of GIP circuits (GIP1~GIP6) has to be formed in the display area (D/A). To this end, each pixel is formed at each of both sides of the data line (not shown), whereby the two pixels are driven by one data line (not shown). Thus, it is possible to prepare an area in which the data line (not shown) is not provided, and to provide the plurality of GIP circuits (GIP1~GIP6) in this area without the data line (not shown). This will be described more fully with reference to FIG. 6.

In the non-display area (ND/A), there are a data link line (DLL), a data pad (DP), and a data driver (DD).

The data link line (DLL) is connected with the data line of the display area (D/A). Also, the data link line (DLL) may be connected with various signal lines for the GIP circuit (GIP1~GIP6), for example, a clock signal (CLK) line, a low-potential voltage (VSS) line, a start signal (Vst) line, a reset signal (Vreset) line, and etc.

The data pad (DP) is connected with the data link line (DLL) and the data driver (DD) in a one-to-one correspondence.

The data driver (DD) is connected with the data pad (DP). The data driver (DD) includes a flexible printed circuit film (FPC film) in which a chip including a data integrated circuit is mounted, whereby it is possible to form a COF (Chip On Film) structure, but not limited to this structure. For example, the chip may be mounted on the substrate 10, to thereby form a COG (Chip On Glass) structure. Although not shown, the flexible printed circuit film (FPC film) is connected with a printed circuit board (PCB), whereby various signals are transmitted from the printed circuit board (PCB) to the flexible printed circuit film (FPC film).

Figure 3:
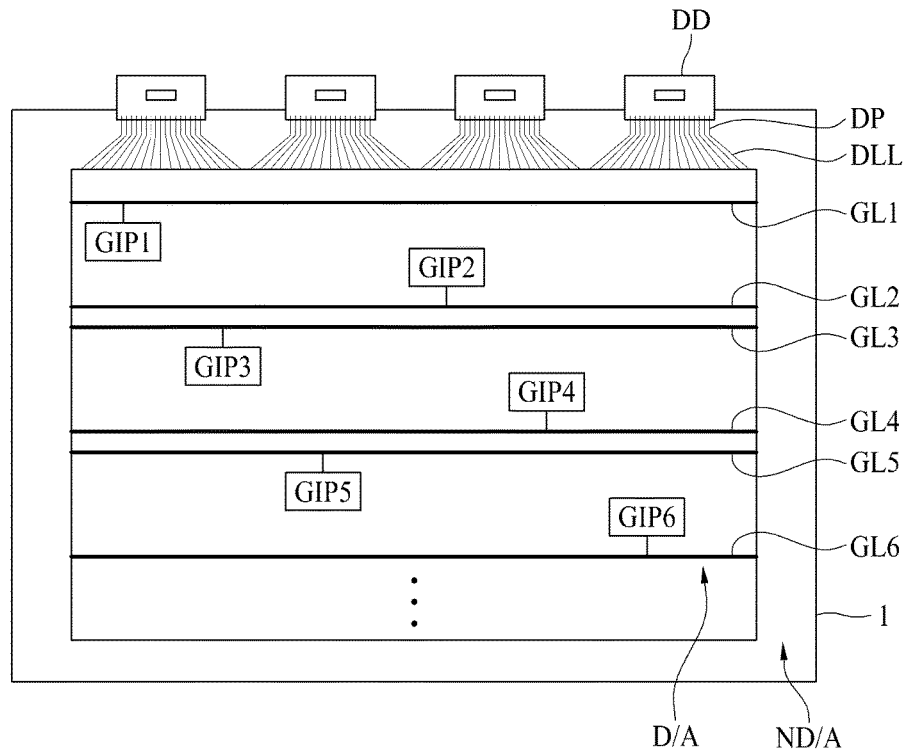
FIG. 3 is a plane view illustrating a display device according to another aspect of the present disclosure.

FIG. 3 is a plane view illustrating a display device according to another aspect of the present disclosure. Except for an arrangement of a plurality of GIP circuits (GIP1~GIP6), the display device according to another aspect of the present disclosure shown in FIG. 3 is substantially the same as the display device according to one aspect of the present disclosure shown in FIG. 2. Accordingly, the same reference numbers will be used throughout the drawings to refer to the same or like parts, and only the different parts will be described in detail as follows.

Referring back to FIG. 2, the first to sixth GIP circuits (GIP1~GIP6) are sequentially shifted at fixed intervals from one side of the substrate 1 to the other side of the substrate 1, for example, the left side of the substrate 1 to the right side of the substrate 1.

Meanwhile, in FIG. 3, the odd-numbered GIP circuits (GIP1, GIP3, GIP5) are disposed at the left-side area of the substrate 1 with respect to the center of the substrate 1, and the even-numbered GIP circuits (GIP2, GIP4, GIP6) are disposed at the right-side area of the substrate 1 with respect to the center of the substrate 1. Also, the odd-numbered GIP circuits (GIP1, GIP3, GIP5) are sequentially shifted at fixed intervals from one side of the substrate 1 to the other side of the substrate 1, for example, the left side of the substrate 1 to the right side of the substrate 1, and the even-numbered GIP circuits (GIP2, GIP4, GIP6) are sequentially shifted at fixed intervals from one side of the substrate 1 to the other side of the substrate 1, for example, the left side of the substrate 1 to the right side of the substrate 1.

The different signals, for example, the different clock signals (CLK) may be applied to the first to sixth GIP circuits (GIP1~GIP6). In this case, the clock signal (CLK) may be applied via the clock signal line arranged in the longitudinal direction of the substrate, for example, the second direction which is the same as that of the data line in the area wherein the data line is not formed (See FIG. 6). In order to facilitate the structure of signal line, the first to sixth GIP circuits (GIP1~GIP6) are not overlapped in the second direction wherein the data line is arranged, but not limited to this structure. It is possible to overlap the different GIP circuits (GIP1~GIP6) with each other in the second direction.

Figure 4:
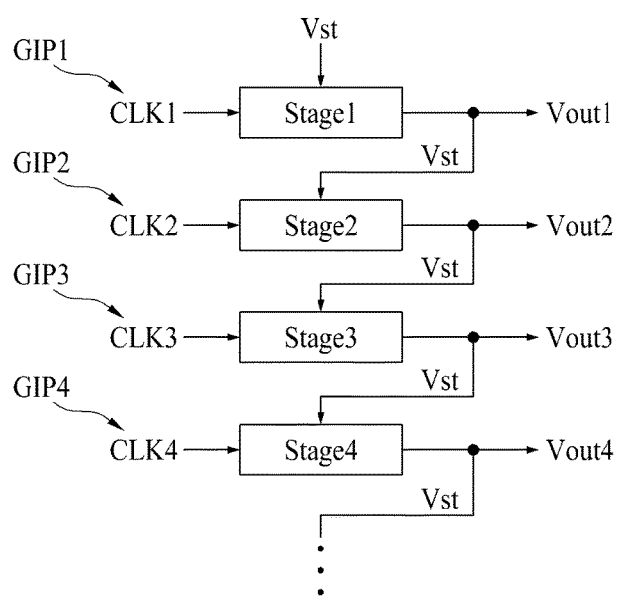
FIG. 4 is a block diagram illustrating a GIP circuit according to one aspect of the present disclosure.
Figure 5:
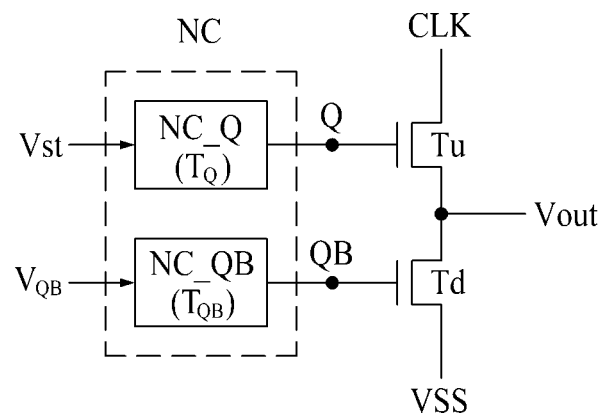
FIG. 5 is a circuit diagram illustrating a GIP circuit according to one aspect of the present disclosure.

Hereinafter, the structure of GIP circuit will be described with reference to FIGS. 4 and 5. FIGS. 4 and 5 show one example of the GIP circuit which is capable of being applied to the present disclosure, but not limited to this structure.

FIG. 4 is a block diagram illustrating the GIP circuits (GIP1~GIP6) according to one aspect of the present disclosure.

As shown in FIG. 4, each of the plurality of GIP circuits (GIP1~GIP6) outputs and supplies a gate signal (Vout1~Vout6) of a high state (High) to a gate line for one frame period.

In detail, the first GIP circuit (GIP1) is started by a separate start signal (Vst) in a first stage (stage1), and the first GIP circuit (GIP1) outputs a first gate signal (Vout1) of a high state generated using a first clock signal (CLK1), and supplies the first gate signal (Vout1) of the high state to the first gate line.

Each of the second to sixth GIP circuits (GIP2~GIP6) is started by a start signal (Vst) corresponding to the gate signals (Vout1~Vout5) of the GIP circuits (GIP1~GIP5) of the prior stage in each of second to sixth stages (Stage2~Stage6), and the second to sixth GIP circuits (GIP2~GIP6) respectively output the second to sixth gate signals (Vout2~Vout6) of a high state generated using second to six clock signals (CLK2~CLK6), and respectively supply the second to sixth gate signals (Vout2~Vout6) to the second to sixth gate lines.

Meanwhile, although not shown, when the final gate signal (Vout) is output from the stage of the final GIP circuit at which one frame is ended, the stage of the final GIP circuit is reset by a reset signal (Vreset). Then, the first gate signal (Vout1) is output from the first stage (stage1) of the first GIP circuit (GIP1) at which the next frame is started, and the aforementioned process is repeated.

FIG. 5 is a circuit diagram illustrating the GIP circuit according to one aspect of the present disclosure. Each of the plurality of GIP circuits (GIP1~GIP6) shown in FIG. 4 may be the same as the circuit shown in FIG. 5, but not limited to this structure.

As shown in FIG. 5, the GIP circuit may include a pull-up node (Q), a pull-down node (QB), a pull-up transistor (Tu), a pull-down transistor (Td), and a node controller (NC).

The pull-up transistor (Tu) is turned-on when the pull-up node (Q) is charged with a gate high voltage, and the pull-down transistor (Td) is turned-on when the pull-down node (QB) is charged with the gate high voltage.

The node controller (NC) controls charging and discharging states in each of the pull-up node (Q) and the pull-down node (QB). To this end, the node controller (NC) may include a pull-up node controller (NC_Q) for controlling the charging and discharging states of the pull-up node (Q), and a pull-down node controller (NC_QB) for controlling the charging and discharging states of the pull-down node (QB). The pull-up node controller (NC_Q) may include at least one transistor ($T_Q$) for controlling the pull-up node (Q), and the pull-down node controller (NC_QB) may include at least one transistor ($T_{QB}$) for controlling the pull-down node (QB).

The node controller (NC) enables a stable output of the gate signal (Vout). In detail, if the pull-up node (Q) is charged with the gate high voltage, the pull-down node (QB) is discharged to a gate low voltage by the node controller (NC). If the pull-down node (QB) is charged with the gate high voltage, the pull-up node (Q) is discharged to the gate low voltage by the node controller (NC).

Accordingly, when the start signal (Vst) is applied, the plurality of transistors ($T_Q$, $T_{QB}$) included in the node controller (NC) are operated to charge the pull-up node (Q) with the gate high voltage and to discharge the pull-down node (QB) to the gate low voltage, to thereby output the gate signal (Vout) for the clock signal (CLK). Also, when a discharging signal ($V_{QB}$) is applied, the plurality of transistors ($T_Q$, $T_{QB}$) included in the node controller (NC) are operated to discharge the pull-up node (Q) to the gate low voltage and to charge the pull-down node (QB) with the gate high voltage, to thereby output the gate signal (Vout) for the low-potential voltage (VSS).

Referring to the start signal (Vst), the first GIP circuit may use the separately-applied start signal (Vst), and the second to sixth GIP circuits may use the start signal (Vst) corresponding to the gate signal (Vout) which is output from the GIP circuit of the prior stage.

Referring to the discharging signal ($V_{QB}$), it is possible to use the gate signal (Vout) which is output from the prior stage for the discharging signal ($V_{QB}$), or to use a separate clock signal (CLK) for the discharging signal ($V_{QB}$).

At least one transistor ($T_Q$) included in the pull-up node controller (NC_Q) and at least one transistor ($T_{QB}$) included in the pull-down node controller (NC_QB) may be changed to various types generally known to those in the art.

Figure 6:
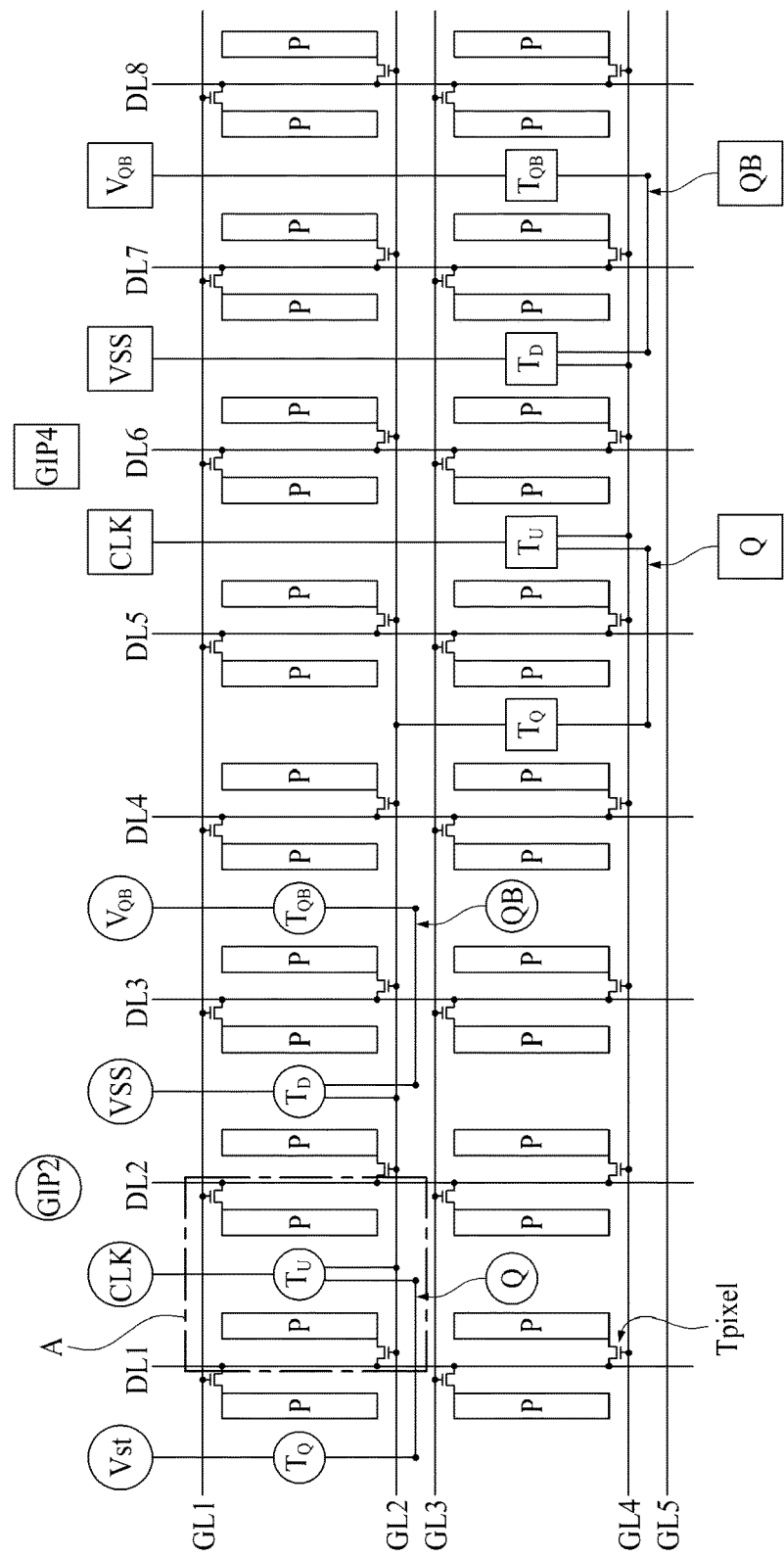
FIG. 6 is a plane view illustrating a display area of the display device according to one aspect of the present disclosure.

FIG. 6 is a plane view illustrating the display area of the display device according to one aspect of the present disclosure.

As shown in FIG. 6, the display area of the display device according to one aspect of the present disclosure may include gate lines (GL1~GL5), data lines (DL1~DL8), a pixel transistor (Tpixel), a pixel electrode (P), and GIP circuits (GIP2, GIP4).

For convenience of explanation, FIG. 6 shows the second GIP circuit (GIP2) for supplying the gate signal to the second gate line (GL2), and the fourth GIP circuit (GIP4) for supplying the gate signal to the fourth gate line (GL4). Also, for convenience of explanation, elements for the second GIP circuit (GIP2) are shown in a type of circle shape, and elements for the fourth GIP circuit (GIP4) are shown in a type of quadrangle.

The plurality of gate lines (GL1~GL5) are arranged in a latitudinal direction, and the plurality of data lines (DL1~DL8) are arranged in a longitudinal direction. The pixel region is defined by the plurality of gate lines (GL1~GL5) and the plurality of data lines (DL1~DL8), and the pixel transistor (Tpixel) and the pixel electrode (P) are provided in the pixel region.

The pixel region is provided between a first gate line (GL1) and a second gate line (GL2), and between a third gate line (GL3) and a fourth gate line (GL4). But, the pixel region is not provided between the second gate line (GL2) and the third gate line (GL3). An interval between the second gate line (GL2) and the third gate line (GL3) is smaller than an interval between the first gate line (GL1) and the second gate line (GL2). And, an interval between the first gate line (GL1) and the second gate line (GL2) is the same as an interval between the third gate line (GL3) and the fourth gate line (GL4).

The two pixel transistors (Tpixel) which are positioned at both sides of each data line are respectively connected with one data line (DL1~DL8). Accordingly, the respective pixels are provided at both sides of one data line (DL1~DL8).

The pixel transistor (Tpixel) connected with one side of one data line (DL1~DL8), for example, the left side of one data line is provided at the relatively high position to be connected with the gate lines (GL1, GL3, GL5), and the pixel transistor (Tpixel) connected with the other side of one data line (DL1~DL8), for example, the right side of one data line is provided at the relatively low position to be connected with gate lines (GL2, GL4), whereby it is possible to prepare the two pixels with one data line (DL1~DL8) and the two gate lines (GL1~GL5). For example, in case of the area between the first gate line (GL1) and the second gate line (GL2), the pixels connected with the first data line (DL1) are provided at the left and right sides of the first data line (DL1), and the pixels connected with the second data line (DL2) are provided at the left and right sides of the second data line (DL2) positioned adjacent to the first data line (DL1). Thus, the data line (DL1~DL8) is not formed between the pixel positioned at the right side of the first data line (DL1) and the pixel positioned at the left side of the second data line (DL2).

As described in FIG. 5, the GIP circuit (GIP2, GIP4) may include a start signal (Vst), a clock signal (CLK), a low-potential voltage (VSS), a discharging signal ($V_{QB}$), a pull-up transistor (Tu), a pull-down transistor (Td), a pull-up node (Q), a pull-down node (QB), a transistor ($T_Q$) for controlling the pull-up node (Q), and a transistor ($T_{QB}$) for controlling the pull-down node (QB). In FIG. 6, a separate start signal (Vst) is applied to the second GIP circuit (GIP2), and the fourth GIP circuit (GIP4) uses a start signal corresponding to the gate signal of the second gate line (GL2), but not necessarily. A structure of each of the GIP circuits (GIP2, GIP4) is the same as the aforementioned structure, whereby a detailed description for the structure of each GIP circuit will be omitted.

Signal lines for the start signal (Vst), the clock signal (CLK), the low-potential voltage (VSS), and the discharging signal ($V_{QB}$) are disposed in the area corresponding to the boundaries between the pixels, that is, the area in which the data line (DL1~DL8) is not formed. Also, the pull-up transistor (Tu), the pull-down transistor (Td), the transistor ($T_Q$) for controlling the pull-up node (Q), and the transistor ($T_{QB}$) for controlling the pull-down node (QB) are disposed in the area corresponding to the boundaries between the pixels, that is, the area in which the data line (DL1~DL8) is not formed.

According to one aspect of the present disclosure, the various signal lines and transistors for the GIP circuit (GIP2, GIP4) are disposed in the area corresponding to the boundaries between the pixels, that is, the area in which the data line (DL1~DL8) is not formed, whereby it is possible to form the GIP circuit (GIP2, GIP4) in the display area, and thus to decrease a bezel width corresponding to the non-display area.

Especially, according as the various signal lines and transistors for the GIP circuit (GIP2, GIP4) are disposed in the area corresponding to the boundaries between the pixels, that is, the area in which the data line (DL1~DL8) is not formed, there is no need to increase the size of pixel, and an aperture ratio is not lowered since the area corresponding to the boundaries between the pixels is not a light-transmission area. In order to prevent the aperture ratio from being lowered, one transistor for the GIP circuit (GIP2, GIP4) is disposed in the area corresponding to the respective boundaries between the pixels, that is, the area in which the data line (DL1~DL8) is not formed.

FIG. 6 shows one transistor ($T_Q$) for controlling the pull-up node (Q), and one transistor ($T_{QB}$) for controlling the pull-down node (QB), but not necessarily. For example, the plurality of transistors ($T_Q$) for controlling the pull-up node (Q), which are formed in various shapes generally known to those in the art, may be connected with one another, and the plurality of transistors ($T_{QB}$) for controlling the pull-down node (QB), which are formed in various shapes generally known to those in the art, may be connected with one another. In this case, all the transistors ($T_Q$, $T_{QB}$) may not be disposed in the area corresponding to the respective boundaries between the pixels, that is, the area in which the data line (DL1~DL8) is not formed, but one transistor ($T_Q$, $T_{QB}$) may be disposed in the area corresponding to the respective boundaries between the pixels, that is, the area in which the data line (DL1~DL8) is not formed. Accordingly, the plurality of transistors ($T_Q$, $T_{QB}$) disposed in the boundaries between the different pixels may be connected through the pull-up node (Q), the pull-down node (QB), and the gate lines (GL1~GL5).

The lines for the pull-up node (Q) and the pull-down node (QB) may be disposed in the latitudinal direction while being in parallel to the gate line (GL1~GL5). Especially, the lines for the pull-up node (Q) and the pull-down node (QB) may be disposed in the area between the adjacent two gate lines (GL2, GL3), and more particularly, the area between the two gate lines (GL2, GL3) where the pixel is not provided, to thereby prevent the aperture ratio from being lowered.

The lines for the pull-up node (Q) and the pull-down node (QB) may be formed of the same material as that of the gate line (GL1~GL5), and may be provided in the same layer as that of the gate line (GL1~GL5). Thus, the lines for the pull-up node (Q) and the pull-down node (QB) may be manufactured without an additional process.

Hereinafter, an individual pixel structure will be described in detail as follows.

Figure 7:
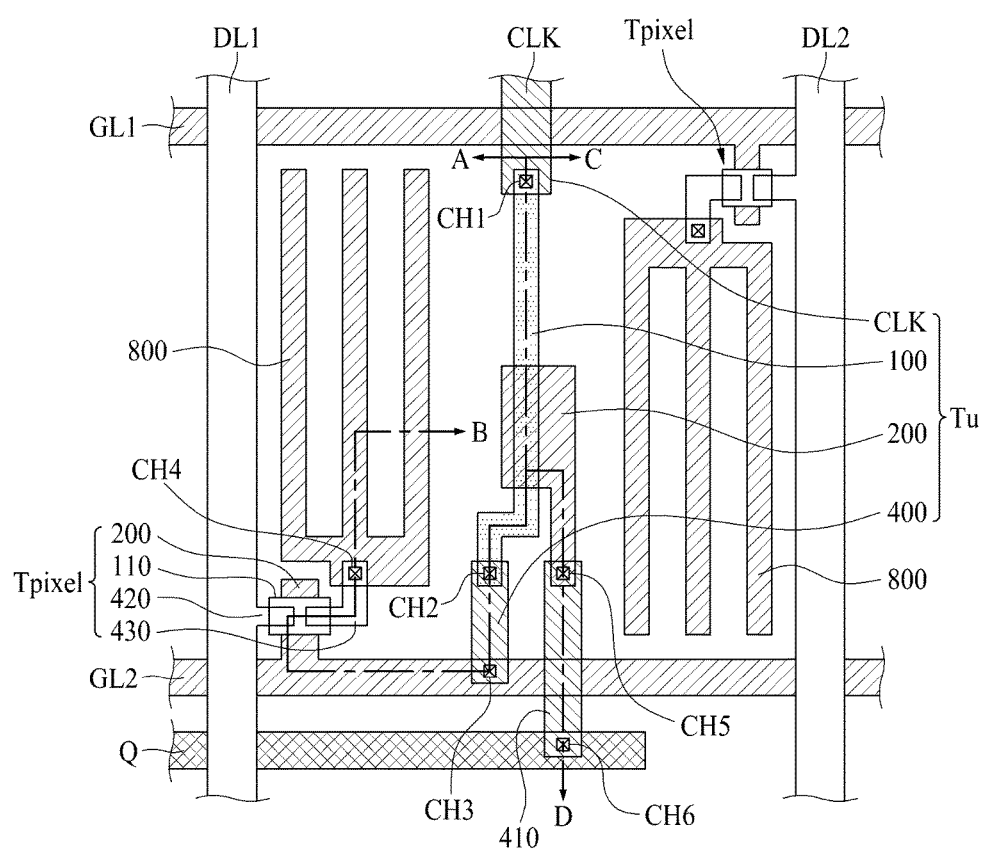
FIG. 7 is a p lane view illustrating a pixel structure of the display device according to one aspect of the present disclosure.

FIG. 7 is a plane view illustrating the pixel structure of the display device according to one aspect of the present disclosure. FIG. 7 is an expanded view illustrating 'A' of FIG. 6, which shows the area with the pull-up transistor (Tu).

As shown in FIG. 7, the first data line (DL1) and the second data line (DL2) which are adjacent to each other in the longitudinal direction are arranged in the area between the first gate line (GL1) and the second gate line (GL2) which are arranged in the latitudinal direction.

A pixel transistor (Tpixel) and a pixel electrode 800 are formed at the right side of the first data line (DL1), and another pixel transistor (Tpixel) and another pixel electrode 800 are formed at the left side of the second data line (DL2). The pixel transistor (Tpixel) formed at the right side of the first data line (DL1) is connected with the first data line (DL1) and the second gate line (GL2), and the pixel transistor (Tpixel) formed at the left side of the second data line (DL2) is connected with the second data line (DL2) and the first gate line (GL1), but not limited to this structure. For example, the pixel transistor (Tpixel) formed at the right side of the first data line (DL1) may be connected with the first data line (DL1) and the first gate line (GL1), and the pixel transistor (Tpixel) formed at the left side of the second data line (DL2) may be connected with the second data line (DL2) and the second gate line (GL2).

The pixel transistor (Tpixel) may include a gate electrode 200 connected with the gate line (GL1, GL2), an active layer 110 including an electron transfer channel, a source electrode 420 connected with the data line (DL1, DL2), and a drain electrode 430 facing the source electrode 420.

The pixel electrode 800 is connected with the drain electrode 430 of the pixel transistor (Tpixel) via a fourth contact hole (CH4). The pixel electrode 800 may be formed in a fork structure, but not limited to this structure.

The data line (DL1, DL2) is not formed in the area between the pixel electrode 800 formed at the right side of the first data line (DL1) and the pixel electrode 800 formed at the left side of the second data line (DL2). Instead of the data line (DL1, DL2), the clock signal (CLK) line and the pull-up transistor (Tu) are formed in the area between the pixel electrode 800 formed at the right side of the first data line (DL1) and the pixel electrode 800 formed at the left side of the second data line (DL2).

The clock signal (CLK) line is arranged in parallel to the data line (DL1, DL2).

The pull-up transistor (Tu) may include a gate electrode 200, an active layer 100, the clock signal (CLK) line serving as a source electrode, and a drain electrode 400.

The gate electrode 200 is connected with the pull-up node (Q) via a connection electrode 410. In detail, one end of the connection electrode 410 is connected with the gate electrode 200 via a fifth contact hole (CH5), and the other end of the connection electrode 410 is connected with the pull-up node (Q) line via a sixth contact hole (CH6).

The pull-up node (Q) line is arranged in the latitudinal direction, that is, the pull-up node (Q) line is formed at the same direction as the second gate line (GL) under the second gate line (GL). In this case, if the pull-up node (Q) line and the second gate line (GL) are formed at the same layer, it is impossible to extend the gate electrode 200 through the second gate line (GL) for the connection with the pull-up node (Q) line. Thus, the gate electrode 200 and the pull-up node (Q) line are connected with each other through the connection electrode 410. Accordingly, the connection electrode 410 is formed in the different layer from the gate electrode 200 and the pull-up node (Q) line.

The clock signal (CLK) line serving as the source electrode is connected with one end of the active layer 100 via a first contact hole (CH1). The drain electrode 400 is connected with the other end of the active layer 100 via a second contact hole (CH2), and is connected with the second gate line (GL2) via a third contact hole (CH3).

In case of the pull-up transistor (Tu), if the high voltage is applied to the gate electrode 200 through the pull-up node (Q) line, the clock signal (CLK), which is transmitted through the clock signal (CLK) line corresponding to the source electrode, is supplied to the second gate line (GL2) through the drain electrode 400. As a result, the gate signal is provided to the second gate line (GL2).

A cross sectional structure of the pixel transistor (Tpixel) and the pull-up transistor (Tu) will be described with reference to FIG. 8.

Figure 8:
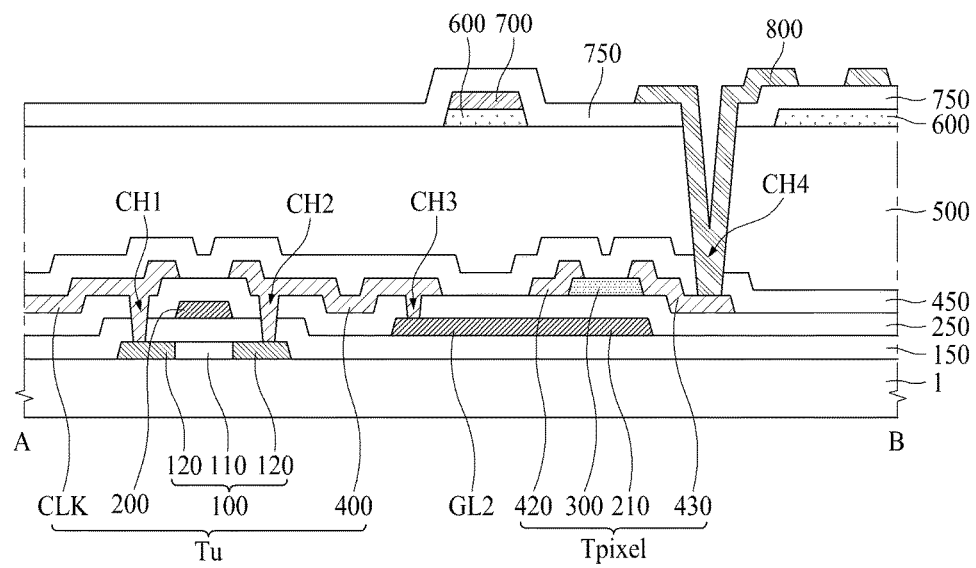
FIG. 8 is a cross sectional view along A-B line of FIG. 7, which shows the pixel structure of the display device according to one aspect of the present disclosure.

FIG. 8 is a cross sectional view illustrating the pixel structure of the display device according to one aspect of the present disclosure, which corresponds to a cross section along A-B line of FIG. 7.

As shown in FIG. 8, the pull-up transistor (Tu) and the pixel transistor (Tpixel) are provided on the substrate 1.

The pull-up transistor (Tu) may include a first active layer 100, a first gate electrode 200, a clock signal (CLK) line serving as a first source electrode, and a first drain electrode 400.

The first active layer 100 may include a channel area provided on the substrate 1, and a doping layer 120 disposed at each of both sides of the channel area 110.

The first gate electrode 200 is spaced apart from the active layer 100 by a first gate insulating film 150 interposed in-between. The first gate electrode 200 is positioned at an area corresponding to the channel area 110. In this case, the doping layer 120 may be obtained by doping the first active layer 100 using the first gate electrode 200 as a mask.

The clock signal (CLK) line serving as the first source electrode and the first drain electrode 400 are spaced apart from the first gate electrode 200, wherein a second gate insulating film 250 is interposed between the first gate electrode 200 and the clock signal (CLK) line serving as the first source electrode, and between the first gate electrode 200 and the first drain electrode 400. The clock signal (CLK) line is connected with the doping layer 120 disposed at one side of the channel area 110 via the first contact hole (CH1) provided in the first gate insulating film 150 and the second gate insulating film 250. The first drain electrode 400 is connected with the doping layer 120 disposed at the other side of the channel area 110 via the second contact hole (CH2) provided in the first gate insulating film 150 and the second gate insulating film 250.

The pull-up transistor (Tu) may be formed in a top-gate structure obtained by sequentially depositing the first active layer 100, the first gate insulating film 150, the first gate electrode 200, the second gate insulating film 250, and the clock signal (CLK) line serving as the first source electrode/first drain electrode 400 on the substrate 1. Especially, the first active layer 100 may be manufactured by LTPS (Low-Temperature Polycrystalline Silicon) including a deposition process of amorphous silicon, a process of changing the amorphous silicon to crystalline silicon by laser, and a process of forming the doping layer 120 using the first gate electrode 200 as a mask.

Referring back to FIG. 7, as the pull-up transistor (Tu) is formed by the LTPS (Low-Temperature Polycrystalline Silicon), at least one portion of the active layer 100 may be arranged at the same direction as that of the data line (DL1, DL2), that is, at the longitudinal direction in the area between the adjacent pixels 800 so that it is possible to reduce a problem related with lowering of aperture ratio by the pull-up transistor (Tu).

The first drain electrode 400 of the pull-up transistor (Tu) is connected with the second gate line (GL2), whereby the gate signal is supplied to the second gate line (GL2). In detail, the first drain electrode 400 is connected with the second gate line (GL2) via the third contact hole (CH3) provided in the second gate insulating film 250.

The pixel transistor (Tpixel) may include a second gate electrode 210, a second active layer 300, a second source electrode 420, and a second drain electrode 430.

The second gate electrode 210 is connected with the second gate line (GL2). The second gate electrode 210 of the pixel transistor (Tpixel), the second gate line (GL2), and the first gate electrode 200 of the pull-up transistor (Tu) are formed of the same material, and are provided in the same layer.

The second active layer 300 is spaced apart from the second gate electrode 210 by the second gate insulating film 250 interposed in-between. The second active layer 300 may be formed of an oxide semiconductor, but not limited to this material.

The second source electrode 420 and the second drain electrode 430 are provided on the second active layer 300, wherein the second source electrode 420 and the second drain electrode 430 are spaced apart from each other. The second drain electrode 430 and second source electrode 420 of the pixel transistor (Tpixel), and the first drain electrode 400 and clock signal (CLK) line of the pull-up transistor (Tu) may be formed of the same material, and may be provided at the same layer.

Unlike the aforementioned pull-up transistor (Tu), the pixel transistor (Tpixel) may be formed in a bottom-gate structure obtained by sequentially depositing the second gate electrode 210, the second gate insulating film 250, the second active layer 300, and the second source electrode 420/second drain electrode 430 on the first gate insulating film 150. Especially, when the second active layer 300 is formed of an oxide semiconductor, it is possible to improve picture quality by decreasing a leakage current of the pixel transistor (Tpixel), and reducing power consumption by a low-speed driving.

A passivation layer 450 is provided on the pixel transistor (Tpixel) and the pull-up transistor (Tu), and a planarization layer 500 is provided on the passivation layer 450.

A common electrode 600 is provided on the planarization layer 500, and a metal line 700 is provided on the common electrode 600. The common electrode 600 is not formed in the area of the pixel transistor (Tpixel) and the pull-up transistor (Tu). The metal line 700 lowers a resistance of the common electrode 600. The common electrode 600 is provided in an open area through which light passes. Thus, the common electrode 600 is formed of a transparent conductive oxide having a relatively high. Accordingly, the resistance of the common electrode 600 is lowered by the metal line 700. The metal line 700 is not provided in the open area, but provided in an area through which light does not pass, for example, an area overlapped with the gate line (GL1, GL2) or data line (DL1, DL2).

An insulating interlayer 750 is provided on the common electrode 600 and the metal line 700, and a pixel electrode 800 is provided on the insulating interlayer 750. The pixel electrode 800 is connected with the drain electrode 430 of the pixel transistor (Tpixel) via the fourth contact hole (CH4) provided in the passivation layer 450, the planarization layer 500, and the insulating interlayer 750. A fringe field is formed between the pixel electrode 800 and the common electrode 600, and liquid crystal molecules included in a liquid crystal layer are aligned by the fringe field.

Figure 9:
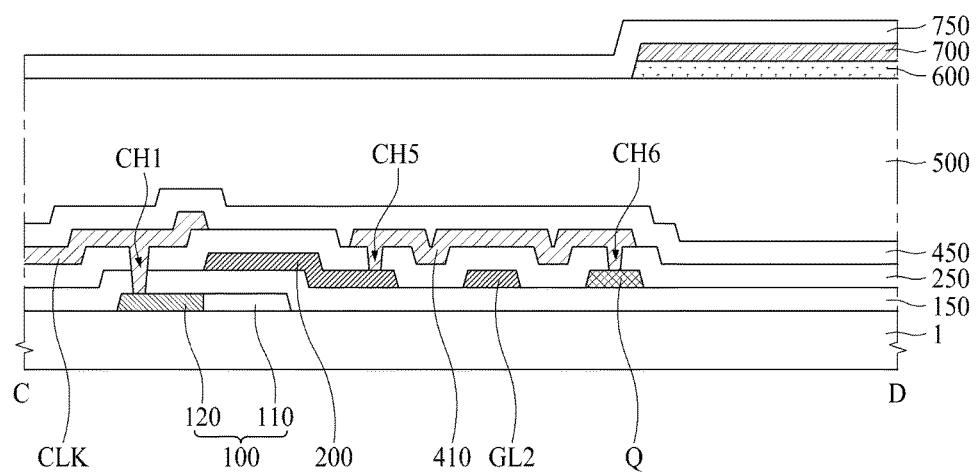
FIG. 9 is a cross sectional view along C-D linen of FIG. 7, which shows the pixel structure of the display device according to one embodiment of the present disclosure.

FIG. 9 is a cross sectional view illustrating the pixel structure of the display device according to one aspect of the present disclosure, which corresponds to a cross section along C-D line of FIG. 7. Wherever possible, the same reference numbers will be used throughout the drawings to refer to the same or like parts, and only different parts will be described in detail.

FIG. 9 shows that the gate electrode 200 of the pull-up transistor (Tu) is connected with the pull-up node (Q) line through the connection electrode 410.

As shown in FIG. 9, the second gate line (GL2) is formed between the gate electrode 200 of the pull-up transistor (Tu) and the pull-up node (Q) line. In this case, the gate electrode 200 of the pull-up transistor (Tu), the pull-up node (Q) line, and the second gate line (GL2) are provided at the same layer. Accordingly, the connection electrode 410 is provided so as to connect the gate electrode 200 of the pull-up transistor (Tu) with the pull-up node (Q) line while being not shorted to the second gate line (GL2).

The connection electrode 410 is provided on the first gate insulating film 250, the connection electrode 410 is connected with the gate electrode 200 of the pull-up transistor (Tu) via the fifth contact hole (CH5) provided in the first gate insulating film 250, and the connection electrode 410 is connected with the pull-up node (Q) line via the sixth contact hole (CH6) provided in the first gate insulating film 250.

Figure 10:
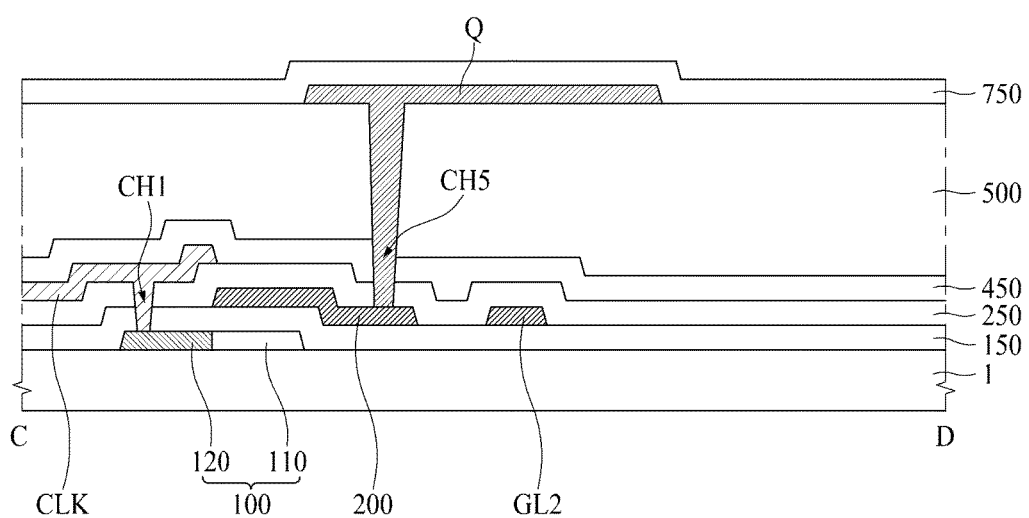
FIG. 10 is a cross sectional view along C-D line of FIG. 7, which shows the pixel structure of the display device according to another aspect of the present disclosure.

FIG. 10 is a cross sectional view illustrating the pixel structure of the display device according to another aspect of the present disclosure, which corresponds to a cross section along C-D line of FIG. 7.

In FIG. 9, the pull-up node (Q) line and the second gate line (GL2) are formed at the same layer. Meanwhile, in FIG. 10, the pull-up node (Q) line is not formed at the same layer as the second gate line (GL2). In detail, the pull-up node (Q) line and the metal line 700 are formed of the same material, and are manufactured by the same process. Thus, the pull-up mode (Q) line is provided on the planarization layer 500. Unlike the aforementioned case of FIG. 9, the case of FIG. 10 does not need the additional connection electrode 410.

Instead, the pull-up node (Q) line may be directly connected with the gate electrode 200 of the pull-up transistor (Tu) via the fifth contact hole (CH5).

Meanwhile, in case of FIG. 10, the common electrode 600 and the metal line 700 are not formed in the area adjacent to the pull-up node (Q) line so as to facilitate the process for the pull-up node (Q) line.

Except that the clock signal (CLK) line is changed into the low-potential voltage (VSS) line, the connection structure between the pull-down node (QB) line and the pull-down transistor (Td) is the same as the aforementioned connection structure between the pull-up node (Q) line and the pull-up transistor (Tu).

The aforementioned description relates to a fringed field switching (FFS) mode liquid crystal display device in which liquid crystal is driven by the fringe field between the pixel electrode 800 and the common electrode 600, but not limited to this type. The present disclosure may be applied to various modes of liquid crystal display device, for example, In-Plane Switching (IPS) mode, Twisted Nematic (TN) mode, Vertical Alignment (VA) mode, and etc. Also, the present disclosure may be applied to an organic light emitting display device.

According to the present disclosure, the GIP circuit is provided in the display area so that it is possible to decrease the size of non-display area, and to decrease the bezel width of the display device.

Especially, the transistor for the GIP circuit is disposed in the area corresponding to the boundaries between the pixels, that is, the area in which the data line is not formed, so that it is possible to prevent the aperture ratio from being lowered by the GIP circuit.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display device comprising:
    a substrate including a display area and a non-display area surrounding the display area;
    a plurality of gate lines arranged to a first direction on the display area;
    a plurality of data lines arranged to a second direction on the display area;
    a plurality of pixels in pixel regions defined by the plurality of gate lines and the plurality of data lines; and
    a gate in panel (GIP) circuit, provided on the display area, for supplying gate signals to the plurality of gate lines,
    wherein the GIP circuit includes a first thin film transistor provided between adjacent pixels and Includes a signal line provided between the adjacent pixels and arranged at the second direction, wherein the signal line functions as a first source electrode of the first thin film transistor,
    wherein the plurality of data lines includes a first data line and a second data line which are adjacent to each other and are arranged in parallel to each other,
    the plurality of pixels includes a first pair of pixels which are connected with the first data line and are respectively provided on the left and right sides of the first data line, and a second pair of pixels which are connected with the second data line and are respectively provided at the left and right sides of the second data line, and
    the first thin film transistor is disposed at an area between one of the first pair of pixels provided at the right side of the first data line and one of the second pair of pixels provided at the left side of the second data line.

2. The display device according to claim 1, wherein the plurality of data lines are not provided between the adjacent pixels provided with the first thin film transistor.

3. The display device according to claim 1, further comprising a second thin film transistor provided in the plurality of pixels, wherein the first thin film transistor included in the GIP circuit has a structure different from that of the second thin film transistor included in the plurality of pixels.

4. The display device according to claim 3, wherein the first thin film transistor comprises:
    a first active layer provided on the substrate, the first active layer including a channel area, and a doping layer disposed at both sides of the channel area;
    a first gate insulating film provided on the first active layer;
    a first gate electrode provided on the first gate insulating film;
    a second gate insulating film provided on the first gate electrode; and
    a first source electrode and a first drain electrode disposed on the second gate insulating film and connected with the doping layer of the first active layer via a contact hole.

5. The display device according to claim 4, wherein the second thin film transistor comprises:
    a second gate electrode provided on the first gate insulating film;
    a second gate insulating film provided on the second gate electrode;
    a second active layer provided on the second gate insulating film; and
    a second source electrode and a second drain electrode provided on the second active layer.

6. The display device according to claim 5, wherein the first active layer is formed of crystalline silicon and the second active layer is formed of oxide semiconductor.

7. The display device according to claim 1, wherein the first thin film transistor includes:
    a first drain electrode connected with one of gate lines among the plurality of gate lines; and
    a first active layer connected with the signal line and the first drain electrode,
    wherein at least a portion of the first active layer is arranged to the second direction between the adjacent pixels.

8. The display device according to claim 1, wherein the GIP circuit includes a node line connected with a first gate electrode of the first thin film transistor, wherein the node line is arranged to the first direction.

9. The display device according to claim 8, wherein the node line and the gate line are formed of the same material, and are provided at the same layer, and the node line and the first gate electrode are connected with each other through a connection electrode.

10. The display device according to claim 8, wherein the node line and the gate line are provided in the different layers from each other, and the node line is directly connected with the first gate electrode via a contact hole.

11. The display device according to claim 1, wherein the GIP circuit comprises a first GIP circuit supplying a gate signal to a first gate line among the plurality of gate lines, and a second GIP circuit supplying the gate signal to a second gate line among the plurality of gate lines, and the first thin film transistor and the second GIP circuit include a pull-up transistor and a pull-down transistor, respectively, wherein the pull-up transistor and the pull-down transistor are provided between a pair of pixels.

12. The display device according to claim 11, wherein the first GIP circuit and the second GIP circuit are not overlapped with each other in the second direction.

13. A display device having a gate in panel structure, comprising:
   first and second gate lines on a display area and disposed to a first direction;
   first and second data lines on the display area and disposed to a second direction and the first and second gate lines and the first and second data lines crossing with each other;
   first and second pixels together defined by the first and second gate lines and first and second data lines;
   a gate in panel (GIP) circuit supplying a gate signal to the first and second gate lines, the GIP circuit including a first thin film transistor disposed between the first and second pixels and including a clock signal line between the first and second pixels,
   wherein the clock signal line is connected with the second gate line.

14. The display device according to claim 13, further comprising second and third thin film transistors disposed at the first and second pixels, respectively.

15. The display device according to claim 14, wherein the first thin film transistor has a structure different from those of the second and third thin film transistors.

16. The display device according to claim 13, further comprising a pull up node line connected with the first thin film transistor.

* * * * *